United States Patent
Yoo et al.

(10) Patent No.: US 8,648,478 B2
(45) Date of Patent: Feb. 11, 2014

(54) FLEXIBLE HEAT SINK HAVING VENTILATION PORTS AND SEMICONDUCTOR PACKAGE INCLUDING THE SAME

(75) Inventors: Jae-Wook Yoo, Suwon-si (KR); Kyoung-Sei Choi, Yongin-si (KR); Eun-Seok Cho, Suwon-si (KR); Mi-Na Choi, Seoul (KR); Hee-Jung Hwang, Suwon-si (KR); Se-Ran Bae, Yongin-so (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 15 days.

(21) Appl. No.: 13/158,486

(22) Filed: Jun. 13, 2011

(65) Prior Publication Data

US 2011/0316144 A1    Dec. 29, 2011

(30) Foreign Application Priority Data

Jun. 25, 2010  (KR) .......................... 10-2010-0060572

(51) Int. Cl.
  *H01L 23/373*  (2006.01)
  *F28F 7/00*  (2006.01)
(52) U.S. Cl.
  USPC .......... 257/786; 257/706; 257/707; 257/713; 257/717; 257/778; 257/E23.101
(58) Field of Classification Search
  USPC ................. 257/625, 675, 706, 707, 717, 720, 257/E23.101; 165/185
  See application file for complete search history.

(56) References Cited

U.S. PATENT DOCUMENTS

| | | | | |
|---|---|---|---|---|
| 4,567,505 A | * | 1/1986 | Pease et al. | 257/713 |
| 5,101,322 A | * | 3/1992 | Ghaem et al. | 361/715 |
| 5,126,829 A | * | 6/1992 | Daikoku et al. | 257/713 |
| 5,168,348 A | * | 12/1992 | Chu et al. | 257/713 |
| 5,464,054 A | * | 11/1995 | Hinshaw et al. | 165/80.3 |
| 5,506,753 A | * | 4/1996 | Bertin et al. | 361/705 |
| 5,653,280 A | * | 8/1997 | Porter | 165/80.3 |
| 5,705,851 A | * | 1/1998 | Mostafazadeh et al. | 257/675 |
| 5,773,362 A | * | 6/1998 | Tonti et al. | 438/665 |
| 5,831,374 A | * | 11/1998 | Morita et al. | 313/46 |
| 5,835,355 A | * | 11/1998 | Dordi | 361/760 |
| 5,862,038 A | * | 1/1999 | Suzuki et al. | 361/704 |
| 5,909,056 A | * | 6/1999 | Mertol | 257/704 |
| 6,043,986 A | * | 3/2000 | Kondo et al. | 361/720 |
| 6,046,907 A | * | 4/2000 | Yamaguchi | 361/704 |
| 6,131,651 A | * | 10/2000 | Richey, III | 165/185 |
| 6,163,073 A | * | 12/2000 | Patel | 257/712 |

(Continued)

FOREIGN PATENT DOCUMENTS

| | | |
|---|---|---|
| JP | 2001-110955 | 4/2001 |
| JP | 2008-277408 | 11/2008 |
| JP | 2009-170548 | 7/2009 |

*Primary Examiner* — Colleen Matthews
*Assistant Examiner* — William Harriston
(74) *Attorney, Agent, or Firm* — Volentine & Whitt, PLLC

(57) ABSTRACT

A heat sink includes a first adhesive layer, and a heat dissipation layer disposed on the first adhesive layer, and has ventilation ports that extend therethrough including through the first adhesive layer and the heat dissipation layer. The heat sink forms an outermost part of a semiconductor package. Thus, when the heat sink is bonded via its adhesive layer to underlying structure during a manufacturing process, the ventilation ports allow air to pass therethrough. As a result, air is not trapped in the form of bubbles between the heat sink and the underlying structure.

17 Claims, 8 Drawing Sheets

(56) References Cited

U.S. PATENT DOCUMENTS

| | | | |
|---|---|---|---|
| 6,172,872 B1* | 1/2001 | Katsui | 361/695 |
| 6,219,242 B1* | 4/2001 | Martinez | 361/704 |
| 6,278,182 B1* | 8/2001 | Liu et al. | 257/712 |
| 6,288,900 B1* | 9/2001 | Johnson et al. | 361/705 |
| 6,367,541 B2* | 4/2002 | McCullough | 165/80.3 |
| 6,373,703 B2* | 4/2002 | Johnson et al. | 361/704 |
| 6,385,047 B1* | 5/2002 | McCullough et al. | 361/704 |
| 6,433,420 B1* | 8/2002 | Yang et al. | 257/712 |
| 6,492,724 B2* | 12/2002 | Gaynes et al. | 257/707 |
| 6,528,876 B2* | 3/2003 | Huang | 257/706 |
| 6,614,657 B2* | 9/2003 | Searls et al. | 361/704 |
| 6,660,203 B1* | 12/2003 | Fujimoto et al. | 264/171.13 |
| 6,680,015 B2* | 1/2004 | McCullough | 264/105 |
| 6,735,077 B2* | 5/2004 | Yamazaki et al. | 361/689 |
| 6,747,873 B1* | 6/2004 | Searls et al. | 361/695 |
| 6,847,113 B2* | 1/2005 | Nakanishi et al. | 257/712 |
| 6,849,941 B1* | 2/2005 | Hill et al. | 257/710 |
| 6,882,041 B1* | 4/2005 | Cheah et al. | 257/704 |
| 6,891,259 B2* | 5/2005 | Im et al. | 257/687 |
| 6,906,921 B2* | 6/2005 | Searls et al. | 361/695 |
| 6,975,512 B1* | 12/2005 | Ooi | 361/704 |
| 7,015,577 B2* | 3/2006 | Wang | 257/707 |
| 7,044,212 B1* | 5/2006 | Hofmann | 165/185 |
| 7,077,858 B2* | 7/2006 | Fletcher et al. | 607/104 |
| 7,196,904 B2* | 3/2007 | Ku | 361/703 |
| 7,203,065 B1* | 4/2007 | Sin Yan Too | 361/704 |
| 7,256,493 B2* | 8/2007 | Meyer-Berg | 257/713 |
| 7,284,596 B2* | 10/2007 | Larson | 165/80.3 |
| 7,315,080 B1* | 1/2008 | Fan et al. | 257/717 |
| 7,399,919 B2* | 7/2008 | McCutcheon et al. | 174/16.3 |
| 7,504,736 B2* | 3/2009 | Kim et al. | 257/796 |
| 7,554,190 B2* | 6/2009 | Macris et al. | 257/706 |
| 7,583,502 B2* | 9/2009 | Tsao et al. | 361/697 |
| 7,663,212 B2* | 2/2010 | Otremba | 257/678 |
| 7,748,440 B2* | 7/2010 | Michel et al. | 165/185 |
| 7,787,250 B2* | 8/2010 | Li et al. | 361/715 |
| 7,814,965 B1* | 10/2010 | Spokoiny et al. | 165/80.3 |
| 7,826,228 B2* | 11/2010 | Audet et al. | 361/704 |
| 7,848,108 B1* | 12/2010 | Archambeault et al. | 361/719 |
| 7,868,472 B2* | 1/2011 | Kelly | 257/796 |
| 7,995,344 B2* | 8/2011 | Dando et al. | 361/710 |
| 8,018,072 B1* | 9/2011 | Miks et al. | 257/777 |
| 8,081,468 B2* | 12/2011 | Hill et al. | 361/710 |
| 8,164,182 B2* | 4/2012 | Ong et al. | 257/707 |
| 2001/0009277 A1* | 7/2001 | Gaynes et al. | 257/1 |
| 2001/0047858 A1* | 12/2001 | McCullough | 165/80.3 |
| 2002/0012762 A1* | 1/2002 | Bunyan | 428/40.2 |
| 2002/0043364 A1* | 4/2002 | Suzuki et al. | 165/185 |
| 2002/0079570 A1* | 6/2002 | Ho et al. | 257/697 |
| 2002/0142165 A1* | 10/2002 | Norley et al. | 428/408 |
| 2002/0185270 A1* | 12/2002 | McCullough et al. | 165/185 |
| 2003/0001248 A1* | 1/2003 | Alcoe et al. | 257/678 |
| 2004/0036183 A1* | 2/2004 | Im et al. | 257/796 |
| 2005/0006054 A1* | 1/2005 | Miyazaki et al. | 165/80.3 |
| 2005/0037543 A1* | 2/2005 | Tsumura et al. | 438/123 |
| 2005/0224954 A1* | 10/2005 | Kelly | 257/706 |
| 2005/0269690 A1* | 12/2005 | Meyer-Berg | 257/707 |
| 2006/0035069 A1* | 2/2006 | Hanai | 428/316.6 |
| 2006/0097381 A1* | 5/2006 | Akram | 257/706 |
| 2006/0171124 A1* | 8/2006 | Capp et al. | 361/705 |
| 2006/0185896 A1* | 8/2006 | Ikeda | 174/520 |
| 2007/0053168 A1* | 3/2007 | Sayir et al. | 361/718 |
| 2007/0076381 A1* | 4/2007 | Han et al. | 361/749 |
| 2007/0108595 A1* | 5/2007 | Refai-Ahmed | 257/706 |
| 2008/0006933 A1* | 1/2008 | Huang et al. | 257/712 |
| 2008/0122067 A1* | 5/2008 | Wang | 257/706 |
| 2009/0085047 A1* | 4/2009 | Livesay et al. | 257/89 |
| 2010/0157537 A1* | 6/2010 | Yu et al. | 361/704 |
| 2010/0328947 A1* | 12/2010 | Chang et al. | 362/249.02 |
| 2011/0304991 A1* | 12/2011 | Huang et al. | 361/719 |

\* cited by examiner

(12)	US 8,648,478 B2

FLEXIBLE HEAT SINK HAVING VENTILATION PORTS AND SEMICONDUCTOR PACKAGE INCLUDING THE SAME

This application claims priority from Korean Patent Application No. 10-2010-0060572 filed on Jun. 25, 2010 in the Korean Intellectual Property Office.

BACKGROUND

The inventive concept relates to heat sinks and to semiconductor packages including the same.

With the rapid technological development of electronic devices, semiconductor chips are increasingly becoming more highly integrated and miniaturized. While operating at high speed, small and highly integrated semiconductor chips give off a lot of heat, thereby raising the temperature of peripheral circuits. This high-temperature environment may degrade the performance of the peripheral circuits and adversely affect product reliability. Therefore, heat sinks are being used to dissipate heat from semiconductor chips.

SUMMARY

According to one aspect of the inventive concept, there is provided a heat sink comprising a first adhesive layer, and a heat dissipation layer juxtaposed with and bonded to the first adhesive layer, and wherein the heat sink has ventilation ports each extending therethrough including through the first adhesive layer and the heat dissipation layer.

According to another aspect of the present invention, there is provided a semiconductor package comprising a substrate having opposite upper and lower surfaces, a semiconductor chip mounted to the substrate, and a heat sink covering the semiconductor chip and constituting an outermost portion of the package. The heat sink comprises a first adhesive layer, and a heat dissipation layer disposed on and bonded to the first adhesive layer, and the heat sink has ventilation ports each extending through the first adhesive layer and the heat dissipation layer.

According to another aspect of the inventive concept, there is provided a semiconductor package comprising a substrate having upper and lower major surfaces, a semiconductor chip disposed on the upper surface of the substrate, a molding layer disposed on the substrate and in which the chip is embedded, and a heat sink comprising a first adhesive layer disposed on the molding layer, and a heat dissipation layer disposed on and bonded to the first adhesive layer, and wherein the heat sink has ventilation ports each extending through the first adhesive layer and the heat dissipation layer.

BRIEF DESCRIPTION OF THE DRAWINGS

The above and other aspects and features of the inventive concept will become inform the following detailed description of the preferred embodiments thereof made with reference to the attached drawings, in which.

DETAILED DESCRIPTION OF THE PREFERRED EMBODIMENTS

Figure 1:
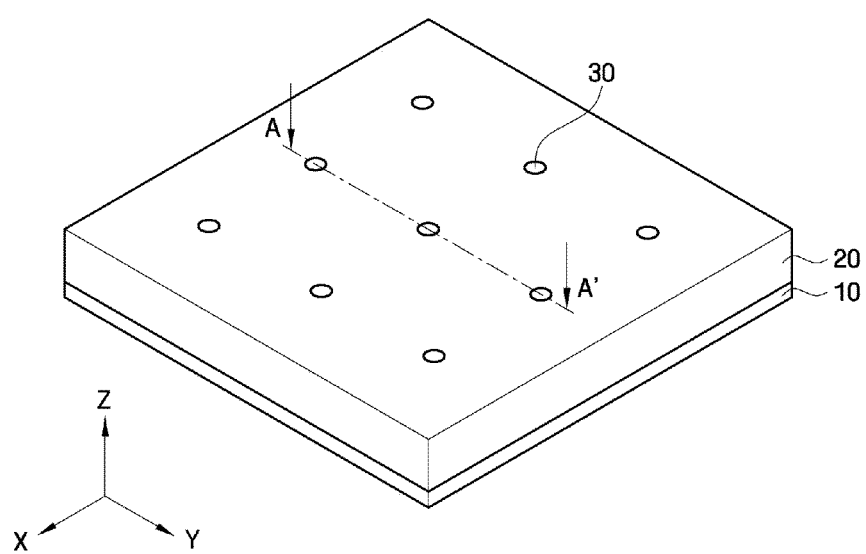
FIG. 1 is a perspective view of a first example of one embodiment of a heat sink according to the inventive concept.

Various embodiments and examples of embodiments of the inventive concept will be described more fully hereinafter with reference to the accompanying drawings. In the drawings, the sizes and relative sizes and shapes of elements may be exaggerated for clarity. Also, like numerals are used to designate like elements throughout the drawings.

Furthermore, spatially relative terms, such as "upper," and "lower" are used to describe an element's and/or feature's relationship to another element(s) and/or feature(s) as illustrated in the figures. Thus, the spatially relative terms may apply to orientations in use which differ from the orientation depicted in the figures. Obviously, though, all such spatially relative terms refer to the orientation shown in the drawings for ease of description and are not necessarily limiting as embodiments according to the inventive concept can assume orientations different than those illustrated in the drawings when in use.

It will also be understood that when an element or layer is referred to as being "on" another element or layer, it can be directly on the other element or layer or intervening elements or layers may be present. In contrast, when an element or layer is referred to as being "directly on" another element or layer, there are no intervening elements or layers present.

Other terminology used herein for the purpose of describing particular examples or embodiments of the inventive concept is to be taken in context. For example, the terms "comprises" or "comprising" when used in this specification specifies the presence of stated features but does not preclude the presence or additional features. The term "juxtaposed" as used to describe the relationship between two layers may refer to either a direct or close side-by-side disposition of two layers.

Various examples of a first embodiment of a heat sink according to the inventive concept will now be described with reference to FIGS. 1 through 4.

Figure 2:
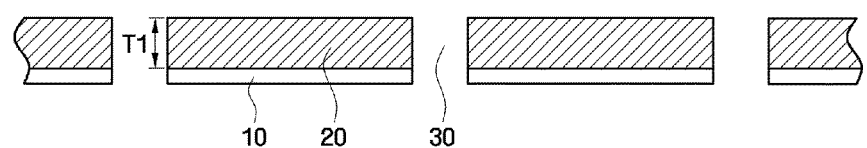
FIG. 2 is a cross-sectional view of the first example of a heat sink according to the inventive concept, taken along line A-A' of FIG. 1.
Figure 3:
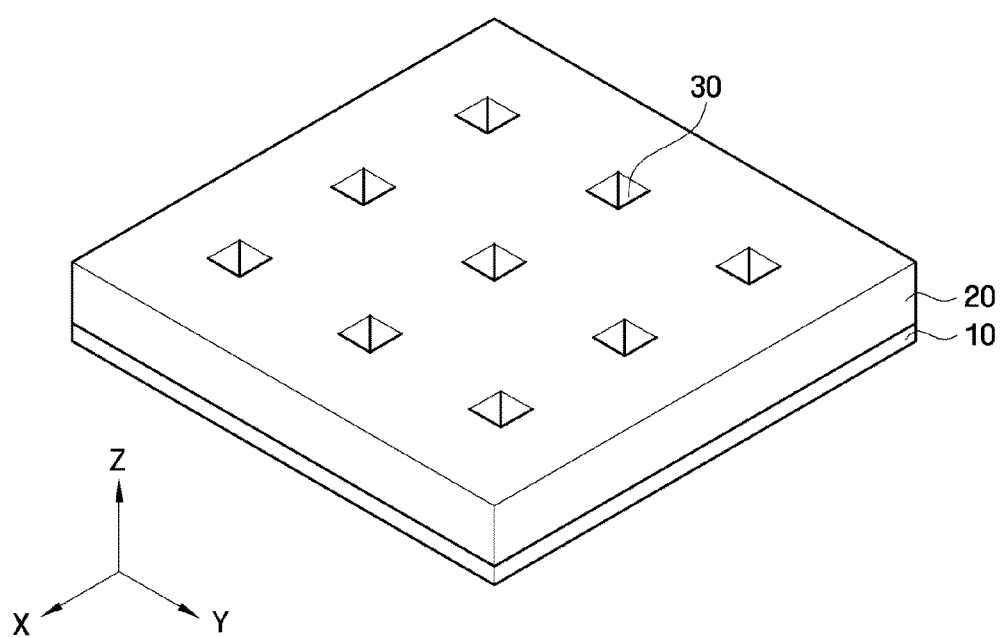
FIGS. 3 and 4 are perspective views of other examples of the first embodiment of a heat sink according to the inventive concept.

Referring first to FIGS. 1 and 2, one example of the heat sink includes a first adhesive layer 10, a heat dissipation layer 20 juxtaposed with the adhesive layer 10 and bonded thereto, and ventilation ports 30.

The first adhesive layer 10 allows the heat dissipation layer 20 to be adhered to (see FIG. 9) a molding layer 120 formed on a substrate 100 to which a semiconductor chip 110 is mounted. The first adhesive layer 10 has a relatively high thermal conductivity so that it may readily transfer heat from the semiconductor chip 110 to the heat dissipation layer 20 and is elastic so that it will return to its original state after being deformed. The elasticity of the first adhesive layer 10 will be described in more detail later. The first adhesive layer 10 may be, for example, a thermally conductive epoxy-based adhesive layer.

FIGS. 1 and 2 show the heat sink as consisting of the heat dissipation layer 20 and the first adhesive layer 10 with the heat dissipation layer 20 being disposed directly on the first adhesive layer 10 so as to be adhered to the first adhesive layer 10. However, when necessary, a base layer (not shown) may be disposed under the first adhesive layer 10 or on the heat dissipation layer 20.

In any case, the heat dissipation layer 20 is of material that can effectively allow heat to dissipate therefrom. For example, the heat dissipation layer 20 of the heat sink in this example may be made of Si, a glass material, or at least one of or an alloy of any one of Al, Cu, In, and Pb.

The heat dissipation layer 20 preferably has thickness T1 of 50 to 200 μm. If the heat dissipation layer 20 were less than 50 μm thick, its ability to dissipate heat would be compromised. On the other hand, if the heat dissipation layer 20 were more than 200 μm thickness, it may not be flexible enough for most practical applications.

The ventilation ports 30 penetrate the first adhesive layer 10 and the heat dissipation layer 20 as shown in FIGS. 1 and 2. When this embodiment of a heat sink according to the inventive concept is bonded to the molding layer 120 (see FIG. 9), the ventilation ports 30 serve as passages through which air remaining between the molding layer 120 and the heat sink flows. If air remaining between the molding layer 120 (see FIG. 9) and the heat sink were not removed during the process in which the heat sink were bonded to the molding layer 120, air bubbles could be formed and trapped on the surface of the heat sink which is bonded to the molding layer 120. This would degrade the heat dissipation characteristics of the heat sink, thereby adversely affecting product reliability. The ventilation ports 30 not only make the heat sink more flexible so that it may be easily bonded to the molding layer 120 (see FIG. 9), for example, but also prevent bubbles from forming and being trapped on the surface of the heat sink which is bonded to the molding layer 120. Consequently, a heat sink according to the inventive concept can improve the reliability of products such as peripheral circuits adjacent an integrated chip package that employs the heat sink.

In FIGS. 1 and 2, the ventilation ports 30 are a plurality of circular holes arrayed in a first direction and a second direction (e.g., in a Y direction and an X direction, respectively, that are orthogonal to one another). However, the ventilation ports 30 do not have to be circular. For example, referring to FIG. 3, the ventilation ports 30 of another example of a heat sink according to of the inventive concept are square holes arrayed in a first direction (e.g., the Y direction) and a second direction (e.g., the X direction). Alternatively, the ventilation ports 30 may be oval holes, diamond-shaped holes, or the like.

Figure 4:
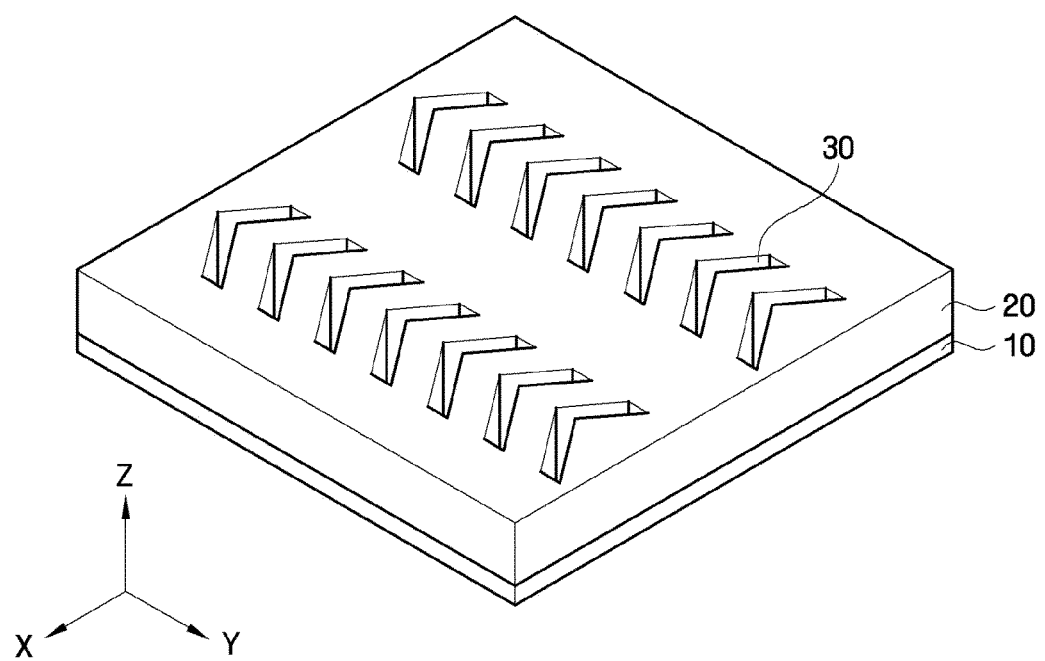

As another example, FIG. 4 shows a heat sink in which the ventilation ports 30 are V-shaped and point in the first direction (e.g., the Y direction), i.e., the ventilation ports 30 have the shape of chevrons. Thus, it should be clear that the cross-sectional shape of the ventilation ports 30 is not especially limited to just those shown in the figures. The ventilation ports 30 of a heat sink according to the inventive concept may have any shape as long as they can prevent air from remaining between the molding layer 120 (see FIG. 9), for example, and the heat sink during the process in which the heat sink is bonded to the molding layer 120.

Figure 5:
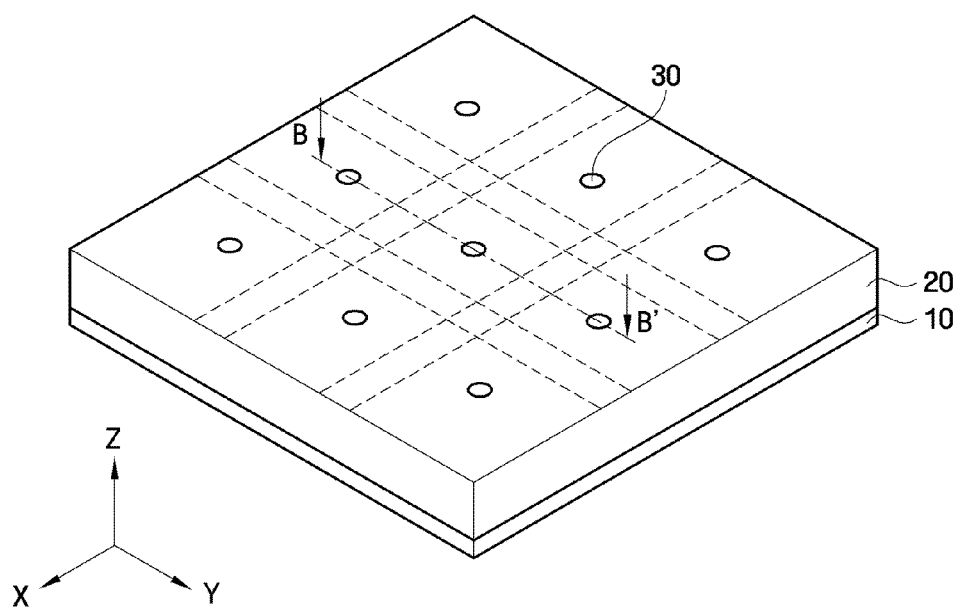
FIG. 5 is a perspective view of a second embodiment of a heat sink according to the inventive concept.
Figure 6:
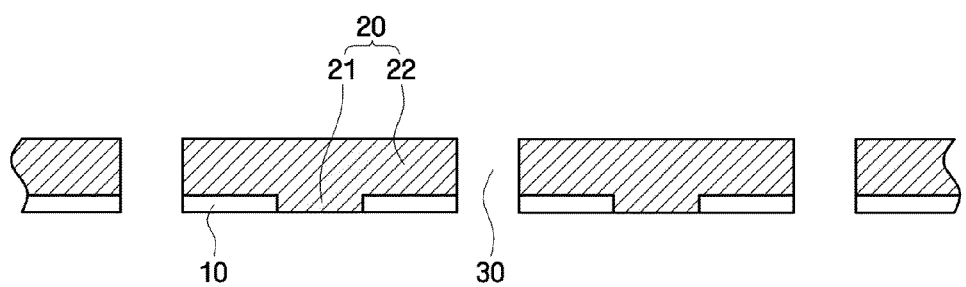
FIG. 6 is a cross-sectional view of the second embodiment of the heat sink according to the inventive concept, taken along line B-B' of FIG. 5.

Hereinafter, another embodiment of a heat sink according to the inventive concept will be described with reference to FIGS. 5 and 6.

In this embodiment, the heat dissipation layer 20 has a plurality of array portions 21 and a bridge portion 22 which is integral with and connects the array portions 21. The array portions 21 lie along or form a lattice. More specifically, the array portions 21 are essentially linear sections of the heat dissipation layer 20 elongated in the first and second directions, and the bottom of the heat dissipation layer 20 has the form of a grid consisting of the array portions 21. Therefore, the array portions 21 delimit open space (nine voids in the example shown in FIG. 5) in the bottom of the heat dissipation layer 20, i.e., in a plane passing through the array portions 21. On the other hand, the top of the heat dissipation layer 20 has the form of a plate or slab consisting of the bridge portion 22 which connects the array portions 22. The first adhesive layer 10 occupies the space delimited by the array portions 21 in the bottom of the heat dissipation layer 20 and is thereby juxtaposed with the heat dissipation layer 20.

The array portions 21 and the bridge portion 22 provide for excellent heat transfer in a horizontal direction (e.g., the Y or X direction).

Figure 7:
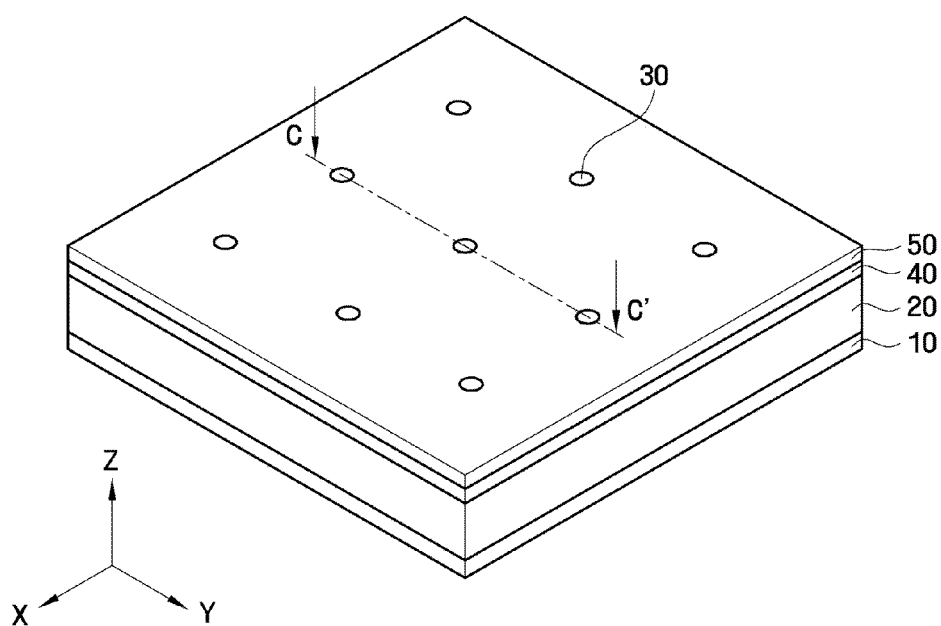
FIG. 7 is a perspective view of a third embodiment of a heat sink according to the inventive concept.

Hereinafter, another embodiment of a heat sink according to the inventive concept will be described with reference to FIGS. 7 and 8.

This embodiment of a heat sink according to the inventive concept is similar to either of those described above, and examples thereof, but further includes a second adhesive layer 40 and a protective layer 50.

Specifically, the protective layer 50 is adhered to the heat dissipation layer 20 by the second adhesive layer 40. That is, the second adhesive layer 40 bonds the heat dissipation layer 20 and the protective layer 50 together and may be made of substantially the same material as a first adhesive layer 10.

The protective layer 50 protects the heat sink and prevents the discoloration of the heat dissipation layer 20. Specifically, the protective layer 50 protects the heat dissipation layer 20 from external blows or foreign substances and prevents the heat dissipation layer 20 from oxidizing especially during a process in which the heat sink is incorporated into a semiconductor package. The protective layer may be a polyimide (PI) film, for example.

Figure 8:
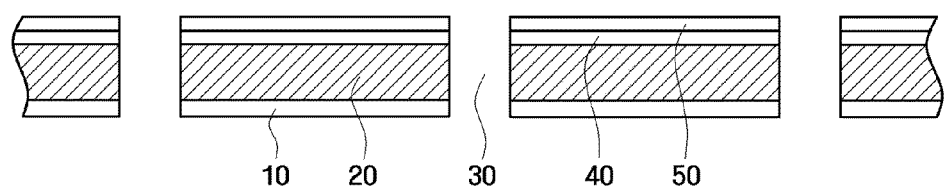
FIG. 8 is a cross-sectional view of the third embodiment of the heat sink according to the inventive concept, taken along line C-C' of FIG. 7.

The ventilation ports 30 may penetrate the protective layer 50 and the second adhesive layer 40, in addition to the heat dissipation layer 20 and the first adhesive layer 10, as shown in FIG. 8. Although FIG. 8 shows the ventilation ports 30 as circular holes, this embodiment of a heat sink according to the inventive concept is not so limited. Rather, the ventilation ports 30 can have any of the above-described shapes. Also, the heat dissipation layer 20 is not limited to the shape shown in FIG. 8 but, for example, may have the same shape as that shown in and described with reference to FIGS. 5 and 6.

A semiconductor package according to the inventive concept will now be described with reference to FIG. 9.

The semiconductor package is a ball grid array (BGA) package. However, the inventive concept is not limited to BGA packages. Rather, the inventive concept is applicable to various other types of semiconductor packages such as flip-chip packages, lead frame packages, and stacked packages.

Figure 9:
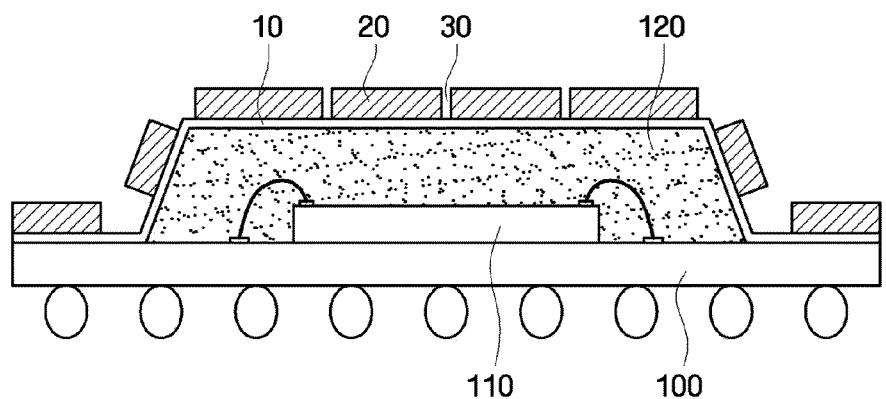
FIG. 9 is a cross-sectional view of an example of one embodiment of a semiconductor package according to the inventive concept.

Referring to FIG. 9, the semiconductor package, i.e., the BGA package, of this example includes a substrate 100, a semiconductor chip 110, a molding layer 120, and a heat sink which includes a first adhesive layer 10, a heat dissipation layer 20, and ventilation ports 30.

The semiconductor chip 110 is mounted to the substrate 100 over a semiconductor chip-mounting area of one surface of the substrate 100. In addition, as shown in FIG. 9, a plurality of contact terminals are formed on a surface of the substrate 100 opposite to that to which the semiconductor chip 110 is mounted.

The molding layer 120 surrounds the semiconductor chip 110 on the substrate 100. That is, the molding layer 120 encapsulates the semiconductor chip 110.

The heat sink is disposed on and adhered to the molding layer 120. Specifically, after the molding layer 120 is formed, the heat sink is formed on the molding layer 120 and the substrate 100 by, for example, stamping the heat sink out of a larger sheet of the same materials/structure in an operation that places the adhesive layer 10 of the punched out heat sink against the molding layer 120 and an exposed region of the substrate 100. During this "punching" process, the ventilation ports 30 allow air between the molding layer 120 and the heat dissipation layer 20 to pass therethrough to the environment outside the package. Also, as a result of the punching process, the ventilation ports 30 may be filled by the first adhesive layer 10 due to the elasticity of the first adhesive layer 10. Therefore, those parts of the ventilation ports 30 extending through the first adhesive layer 10 may disappear once the heat sink is bonded to the molding layer 120. However, the ventilation ports 30 may be designed to be large enough so that they do not become completely obstructed by the first adhesive layer 10 as a result of the punching process. Furthermore, in the case in which certain markings, such as product specifications, must be formed on the heat sink, the ventilation ports 30 may be omitted from an area of the heat sink in which the markings are to be formed. Also, after the heat sink has been bonded to the molding layer 120 as shown in FIG. 9, the size and shape of each of the ventilation portions 30 formed in the heat dissipation layer 20 can be changed according to the shape of the underlying molding layer 120.

The sheet of material from which the heat sink is formed may be carried reel-to-reel during the punching process. That is, due to its flexibility, a heat sink according to the inventive concept can be bonded to the molding layer 120 and the substrate 100 at the last stage of the process of manufacturing the semiconductor package while the heat sink is conveyed in a reel-to-reel manner into juxtaposition with the molding layer 120 and the substrate 100. Accordingly, the heat sink can be incorporated into the semiconductor package using relatively simple manufacturing techniques.

Hereinafter, another example of a semiconductor package according to the inventive concept will be described with reference to FIG. 10. Again, a BGA package will be used as only an example of the type of package to which the inventive concept may be applied.

Figure 10:
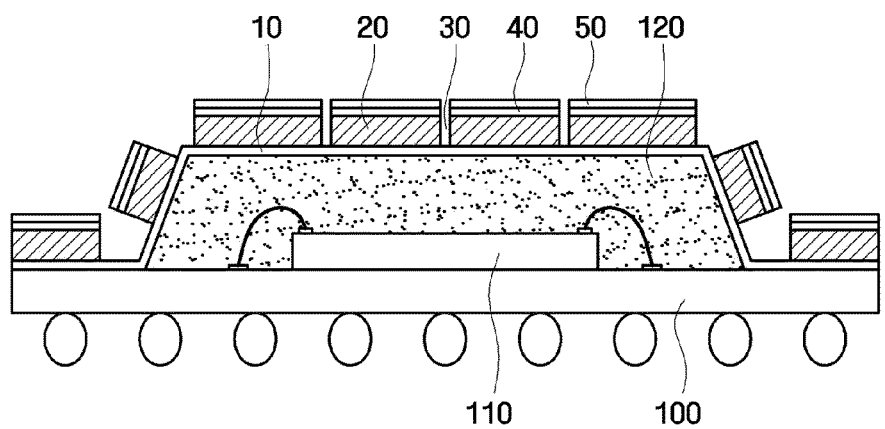
FIG. 10 is a cross-sectional view of another example of an embodiment of a semiconductor package according to the inventive concept.

Referring to FIG. 10, the heat sink of the semiconductor package includes a second adhesive layer 40 and a protective layer 50 formed on the heat dissipation layer 20. That is, the semiconductor package includes a heat sink of the type shown in and described above with reference to FIGS. 7 and 8. The method by which the heat sink is bonded to the molding layer 120 and substrate 100 is similar to that described above.

The performance of a semiconductor package according to the inventive concept will now be described with reference to FIGS. 11 and 12.

Figure 11:
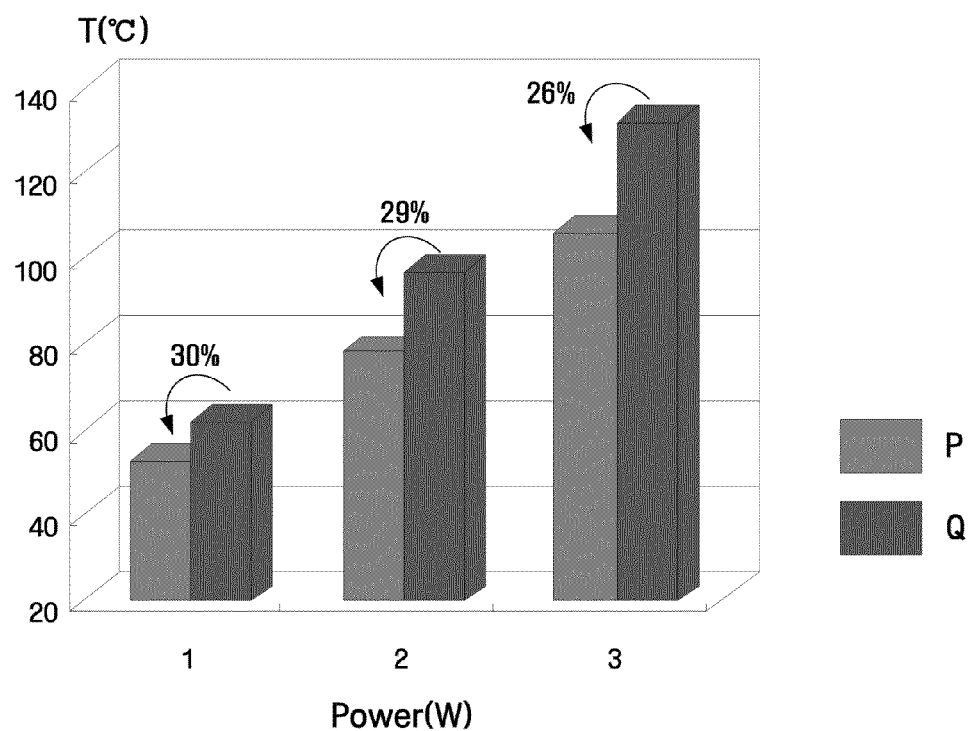
FIG. 11 is a chart illustrating heat dissipation characteristics of a semiconductor package having a heat sink according to the inventive concept and heat dissipation characteristics of a similar semiconductor package but having a conventional heat sink.

FIG. 11 is a graph illustrating heat dissipation characteristics of a semiconductor package having a heat sink according to the inventive concept and of a semiconductor package having a conventional heat sink. Specifically, the letter P in the key of the figure designates heat dissipation characteristics of a BGA package of the type shown in and described with reference to FIG. 10. On the other hand, the letter Q in the key of the figure designates heat dissipation characteristics of a BGA package similar to that shown in FIG. 10 but instead having a (conventional) metal heat sink embedded in the molding layer.

As shown in FIG. 11, the semiconductor package according to the inventive concept exhibits an approximately 30% greater heat dissipation effect than the semiconductor package having a conventional heat sink for each case in which power of a certain level (1, 2 or 3 Watts) is supplied to the packages.

Figure 12:
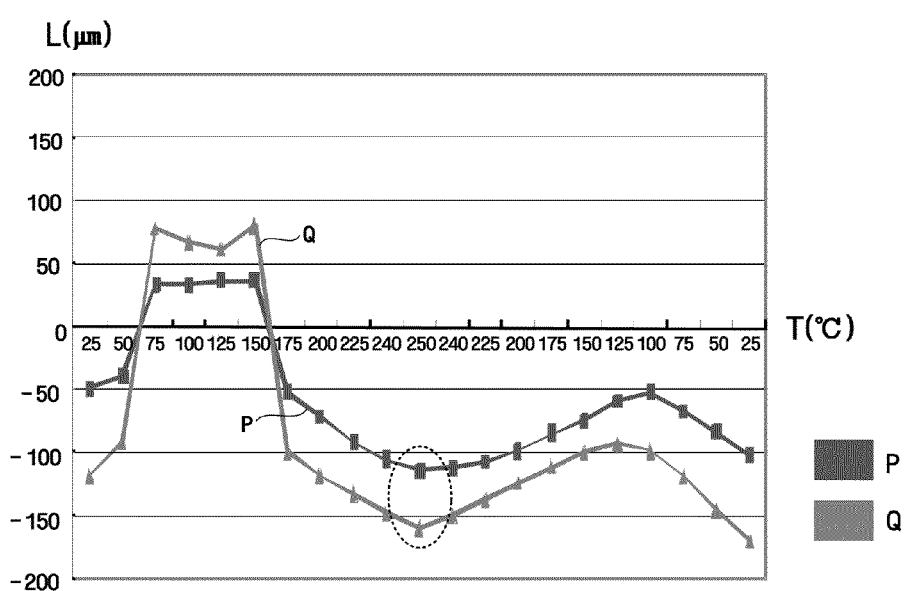
FIG. 12 is a graph illustrating the flexibility of a semiconductor package having a heat sink according to the inventive concept and the flexibility of a similar semiconductor package but having a conventional heat sink.

FIG. 12 is a graph of results of the bending length L of which the heat sink according to the inventive concept and that of which conventional heat sink as the temperature over increases in temperature from 0° to 250° followed by reductions in temperature to 0°. Again, the letter P in the key of the figure designates the results of a BGA package of the type shown in and described with reference to FIG. 10, whereas the letter Q in the key of the figure designates the results of a BGA package similar to that shown in FIG. 10 but instead having a (conventional) metal heat sink embedded in the molding layer.

As shown in FIG. 12, the heat sink of the semiconductor package according to the inventive concept is far more flexible than the conventional heat sink.

Finally, embodiments of the inventive concept have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiments described above but by the following claims.

What is claimed is:

1. A heat sink comprising:
   a first adhesive layer; and
   a heat dissipation layer juxtaposed with and bonded to the first adhesive layer, and
   wherein the heat sink has ventilation ports each extending through the first adhesive layer and the heat dissipation layer,
   the top of the heat dissipation layer consists of a bridge portion in the form of a plate having a top upwardly facing surface and a bottom downwardly facing surface,
   the bottom of the heat dissipation layer consists of a plurality of array portions in the form of a grid which projects downwardly from the bottom surface of the bridge portion, such that the bridge portion is integral with and connects the array portions, the array portions have side surfaces, and the bottom surface of the bridge portion and the side surfaces of the array portions delimit a space in the bottom of the heat dissipation layer, and
   the first adhesive layer extends within the bottom of the heat dissipation layer as in contact with the bottom surface of the plate and the side surfaces of the array portions so as to occupy the space delimited by said bottom and side surfaces.

2. The heat sink of claim 1, wherein the ventilation ports are arrayed along a line in a first direction.

3. The heat sink of claim 2, wherein the ventilation ports are arrayed in both the first direction and in a second direction perpendicular to the first direction, and are each a circular, oval, square, or diamond-shaped hole.

4. The heat sink of claim 2, wherein the ventilation ports are each a V-shaped hole whose apex faces in the first direction.

5. The heat sink of claim 1, wherein the first adhesive layer consists of a thermally conductive elastic epoxy-based material.

6. The heat sink of claim 1, wherein the heat dissipation layer consists of Si, at least one of Al, Cu, In and Pb, or an alloy of at least one of Al, Cu, In and Pb.

7. The heat sink of claim 1, wherein the heat dissipation layer has a thickness of 50 to 200 μm.

8. The heat sink of claim 1, further comprising:
a second adhesive layer disposed on the heat dissipation layer; and
a protective layer disposed on the second adhesive layer,
wherein the ventilation ports extend through the protective layer, the first adhesive layer, the second adhesive layer, and the heat dissipation layer.

9. The heat sink of claim 8, wherein the protective layer comprises a polyimide (PI) film.

10. A semiconductor package comprising:
a substrate having opposite upper and lower surfaces;
a semiconductor chip mounted to the substrate; and
a heat sink covering the semiconductor chip,
wherein the heat sink comprises a first adhesive layer, and a heat dissipation layer juxtaposed with and bonded to the first adhesive layer,
the heat sink has ventilation ports each extending through the first adhesive layer and the heat dissipation layer,
the top of the heat dissipation layer consists of a bridge portion in the form of a plate having a top upwardly facing surface and a bottom downwardly facing surface,
the bottom of the heat dissipation layer consists of a plurality of array portions in the form of a grid which projects downwardly from the bottom surface of the bridge portion, such that the bridge portion is integral with and connects the array portions, the array portions have side surfaces, and the bottom surface of the bridge portion and the side surfaces of the array portions delimit a space in the bottom of the heat dissipation layer, and
the first adhesive layer extends within the bottom of the heat dissipation layer as in contact with the bottom surface of the plate and the side surfaces of the array portions so as to occupy the space delimited by said bottom and side surfaces.

11. The semiconductor package of claim 10, wherein the surface of the package presented beneath the heat sink is stepped, and the heat sink conforms to the stepped surface such that the heat sink has bends in its upper and lower surfaces.

12. The semiconductor package of claim 10, wherein the heat dissipation layer is 50-200 μm thick and consists of Si, at least one of Al, Cu, In and Pb, or an alloy of at least one of Al, Cu, In and Pb.

13. A semiconductor package comprising:
a substrate having upper and lower major surfaces;
a semiconductor chip disposed on the upper surface of the substrate;
a molding layer disposed on the substrate and in which the chip is embedded; and
a heat sink comprising a first adhesive layer disposed on and covering the molding layer on the substrate, and a heat dissipation layer juxtaposed with and bonded to the first adhesive layer, and
wherein the heat sink has ventilation ports each extending through the first adhesive layer and the heat dissipation layer
the top of the heat dissipation layer consists of a bridge portion in the form of a plate having a top upwardly facing surface and a bottom downwardly facing surface,
the bottom of the heat dissipation layer consists of a plurality of array portions in the form of a grid which projects downwardly from the bottom surface of the bridge portion, such that the bridge portion is integral with and connects the array portions, the array portions have side surfaces, and the bottom surface of the bridge portion and the side surfaces of the array portions delimit a space in the bottom of the heat dissipation layer, and
the first adhesive layer extends within the bottom of the heat dissipation layer as in contact with the bottom surface of the plate and the side surfaces of the array portions so as to occupy the space delimited by said bottom and side surfaces.

14. The semiconductor package of claim 13, wherein the heat dissipation layer consists of Si, at least one of Al, Cu, In and Pb, or an alloy of at least one of Al, Cu, In and Pb.

15. The semiconductor package of claim 14, wherein the heat dissipation layer is 50-200 μm thick.

16. The heat sink of claim 1, wherein the array portions project through the first adhesive layer such that the array portions have bottom surfaces that are devoid of the first adhesive layer and the first adhesive layer is confined to a region in the heat sink located beneath the plate and between the ventilation ports and the array portions.

17. The heat sink of claim 1, wherein the heat dissipation layer is 50-200 μm thick and consists of Si, at least one of Al, Cu, In and Pb, or an alloy of at least one of Al, Cu, In and Pb, and
the first adhesive layer consists of an elastic layer of thermally conductive epoxy-based material.

* * * * *